(12) United States Patent
Hsu et al.

(10) Patent No.: US 6,544,849 B2
(45) Date of Patent: Apr. 8, 2003

(54) METHOD OF FABRICATING SEMICONDUCTOR DEVICE FOR PREVENTING POLYSILICON LINE BEING DAMAGED DURING REMOVAL OF PHOTORESIST

(75) Inventors: Shih-Chieh Hsu, Taipei (TW);
Yi-Chung Sheng, Hsinchu (TW);
Chang-Chi Huang, Miaoli (TW);
Sheng-Hao Lin, Hsinchu Hsien (TW);
Cheng-Tung Huang, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/852,254

(22) Filed: May 9, 2001

(65) Prior Publication Data

US 2002/0160601 A1 Oct. 31, 2002

(30) Foreign Application Priority Data

Apr. 30, 2001 (TW) ........................ 90110251 A

(51) Int. Cl.⁷ .......................................... H01L 21/8234
(52) U.S. Cl. ....................... 438/275; 438/304; 438/305; 438/519
(58) Field of Search ................................ 438/204, 234, 438/304–306, 275, 657, 519; 257/355, 328, 361

(56) References Cited

U.S. PATENT DOCUMENTS 5,618,740 A * 4/1997 Huang ........................ 438/224
5,998,274 A * 12/1999 Akram et al. ............... 438/306
6,121,090 A * 9/2000 Wu ............................. 438/275

* cited by examiner

Primary Examiner—Olik Chaudhuri
Assistant Examiner—Hsien Ming Lee

(57) ABSTRACT

A method of fabricating the semiconductor device for preventing polysilicon line from being damaged during removal of a photoresist layer. The method begins by forming polysilicon lines on a core device region and an electrostatic discharge protection device region of a substrate. A plurality of offset spacers is formed on sidewalls of the polysilicon lines. After the offset spacers are formed, a photoresist layer is formed over the substrate to cover the core device region, while exposing the electrostatic discharge protection device region. With the photoresist layer serving as a mask, a punch-through ion implantation is performed on the electrostatic discharge protection device region before the photoresist layer is removed. Next, a plurality of lightly doped source/drain regions is formed in the core device region. A spacer is further formed on the edge of the offset spacer, followed by forming source/drain regions in the core device region and the electrostatic discharge protection device. Since the offset spacers are formed on the sidewalls of the polysilicon lines before the photoresist layer is removed, the offset spacers can protect the polysilicon lines from being broken.

20 Claims, 2 Drawing Sheets

METHOD OF FABRICATING SEMICONDUCTOR DEVICE FOR PREVENTING POLYSILICON LINE BEING DAMAGED DURING REMOVAL OF PHOTORESIST

CROSS-REFERENCE TO RELATED APPLICATION

This application claims the priority benefit of Taiwan application serial no. 90110251, filed on Apr. 30, 2001.

BACKGROUND OF THE INVENTION

1. Field of the Invention

The invention relates in general to a method of fabricating a semiconductor device. More particularly, the invention relates to a method of fabricating the semiconductor device for preventing polysilicon lines from being damaged during removal of a photoresist layer.

2. Description of the Related Art

The input signals to a metal-oxide semiconductor integrated circuit (MOS IC) are usually fed to the gates of MOS transistors. If the voltage applied to the gate insulator becomes excessive, the gate oxide can break down. The main source of such voltages is triboelectricity (electricity caused when two materials are rubbed together). A person can develop a very high static voltage simply by walking across a room, and so as the process of removing an integrated circuit from its plastic package can. If such a high voltage is accidentally applied to pins of an IC package, its discharge (referred to as electrostatic discharge, ESD) can cause breakdown of the gate oxide of the devices to which it is applied, or even a device failure. Therefore, to prevent damage by electrostatic discharge, an electrostatic discharge protection device is often designed in a device or an integrated circuit.

The electrostatic discharge protection device may include a so-called node-to node punch-through electrostatic discharge protection device. The node-to-node punch-through electrostatic discharge protection device is often applied to a complementary metal-oxide semiconductor circuit. The fabrication process comprises implanting arsenic ions or phosphoric ions into a substrate after a polysilicon gate is formed and patterned. In the conventional fabrication process, polysilicon gates of a core transistor in a core device area and an I/O transistor (including a transistor for making the electrostatic discharge protection device) in a peripheral area are often patterned simultaneously. When an ion implantation is performed on the electrostatic discharge protection device, a photoresist layer is formed to cover the core device, exposing only two sides of the polysilicon gate of the I/O transistor to be implanted. After the ion implantation is performed, the photoresist layer is stripped. The method of stripping the photoresist layer includes an oxygen plasma ashing at a temperature of about 200° C. to about 300° C. With the photoresist layer covers the whole core device, implying that the photoresist layer having a large area, a significant thermal stress is caused when the photoresist layer is stripped using the oxygen plasma. As a result, the gate of the core transistor would be broken.

SUMMARY OF THE INVENTION

The invention provides a method of fabricating a semiconductor, to prevent a polysilicon line from being damaged during removal of the photoresist layer.

As embodied herein, the invention provides a method of fabricating the semiconductor device for preventing polysilicon line from being damaged during removal of a photoresist layer. The method begins by forming polysilicon lines on a core device region and an electrostatic discharge protection device region of a substrate. A plurality of offset spacers is formed on sidewalls of the polysilicon lines. After the offset spacers are formed, a photoresist layer is formed over the substrate to cover the core device region, while exposing the electrostatic discharge protection device region. With the photoresist layer serving as a mask, a punch-through ion implantation is performed on the electrostatic discharge protection device region before the photoresist layer is removed. Next, a plurality of lightly doped source/drain regions is formed in the core device region. A plurality of spacers is further formed on the edge of the offset spacers, followed by forming source/drain regions in the core device region and the electrostatic discharge protection device.

Since the offset spacers are formed on the sidewalls of the polysilicon lines before the photoresist layer is removed, the offset spacers can protect the polysilicon line from being broken.

According to the present invention, the drawback of breaking the polysilicon gate can be avoided, while providing advantages of forming the offset spacer, such as preventing the dopant of a lightly doped drain region formed subsequently from diffusing towards the substrate under the gate. Thus, this reduces a gate-to-substrate overlap capacitance, so as to improve the AC performance of the device. As the problems of gate breakage and the gate-to-substrate overlap capacitance are resolved, the invention can be applied to the gate having a smaller linewidth, for example, to the gate of a core transistor with a width of 0.1 micron.

In addition to avoid the gate-to-substrate overlap capacitance as mentioned above, the offset spacer can also be used to adjust the channel length. For example, when a channel length of 0.31 micron is to be formed, the width of the offset spacer can be adjusted to result in a channel length of 0.31 micron as required by specification, even if the gate only has a width of 0.29 micron.

Both the foregoing general description and the following detailed description are exemplary and explanatory only and are not restrictive of the invention, as claimed.

DESCRIPTION OF THE PREFERRED EMBODIMENTS

Figure 1A:
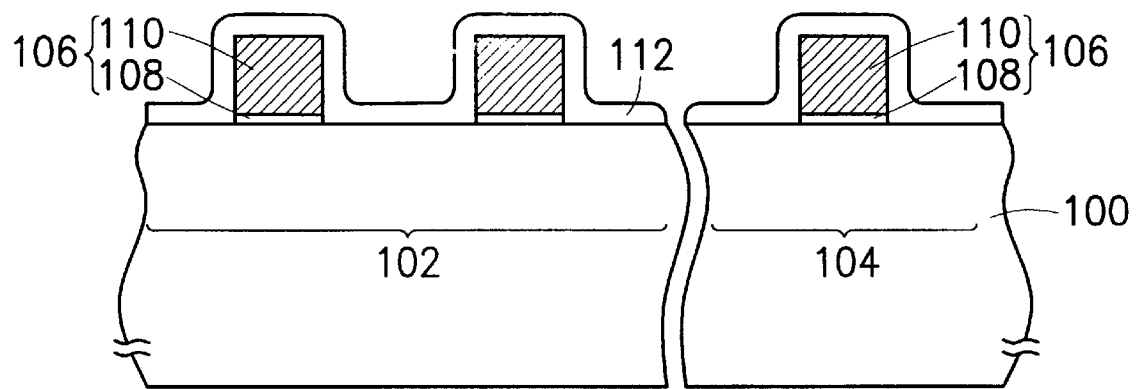
FIG. 1A to FIG. 1F are schematic, cross-sectional views illustrating a method of fabricating the semiconductor device for preventing polysilicon line from being damaged during removal of a photoresist layer according to one preferred embodiment of the invention.

Referring to FIG. 1A to FIG. 1F, an embodiment of the invention is illustrated. In the embodiment, a method of fabricating the semiconductor device for preventing a polysilicon line from being damaged during removal of a photoresist layer is provided. As shown in FIG. 1A, a substrate is provided, wherein the substrate 100 is divided into a core device region and a peripheral circuit device region. The peripheral circuit device region may include regions for forming an ON/OFF switch device and regions for forming an electrostatic discharge protection device, which connects to the ON/OFF switch device. Since the ON/OFF switch device regions and other device regions in the peripheral circuit region are not the main features of the invention, only core device region 102 and electrostatic discharge protection device region 104 are illustrated in the drawing, so as to make the main features of the invention more clear and easily understood.

Referring to FIG. 1A again, a plurality of gate structures 106 is formed on the core device region and the electrostatic discharge protection device region of the substrate 100. Each of the gate structures 106 comprises of a gate oxide layer 108 formed on the substrate 100 and a gate conducting layer 110 on the gate oxide layer 108. The gate oxide layer 108 may be formed by a method, such as thermal oxidation. The gate conducting layer 110 may include polysilicon, while the method for forming the gate conducting layer 110 includes, for example, chemical vapor deposition (CVD). Since the gate structure 106 can be formed in a line and the gate conducting layer 110 is made up of polysilicon, the gate structure also can be known as a polysilicon line.

Next, an offset spacer material layer 112 is formed on the substrate 100 to cover a surface of the gate structure 106 and the substrate 100. The offset spacer material layer 112 may include material such as silicon oxide, while the method of forming includes chemical vapor deposition to form the offset spacer material layer 112 having a preferred thickness of about 300 angstroms.

Figure 1B:
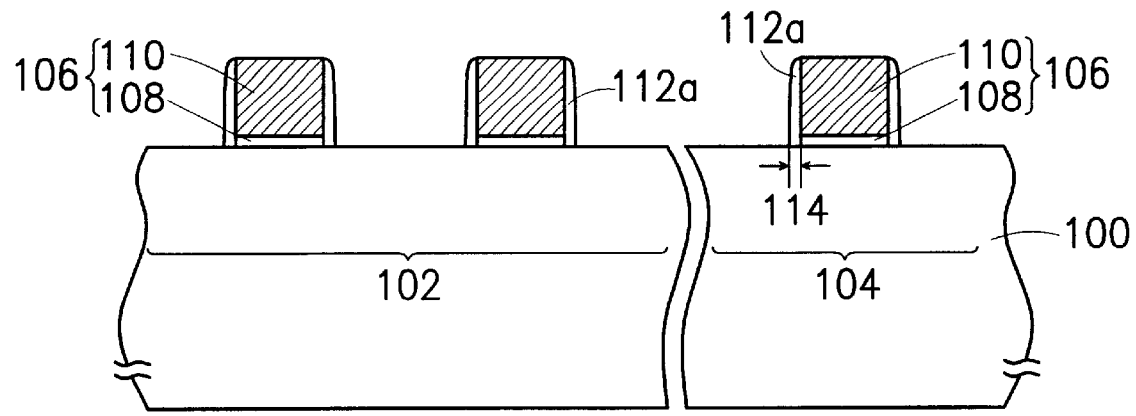

Referring to FIG. 1B, an etching back, such as anisotropic etching, is performed on the offset spacer material layer 112 to remove a portion of the offset spacer material layer 112. This leaves a portion of the offset spacer material layer 112 to form an offset spacer 112a on a sidewall of the gate structure 106. For the fabrication process of a device having a size of 0.1 micron, the offset spacer 112a has a preferred width 114 of about 100 angstroms.

Figure 1C:
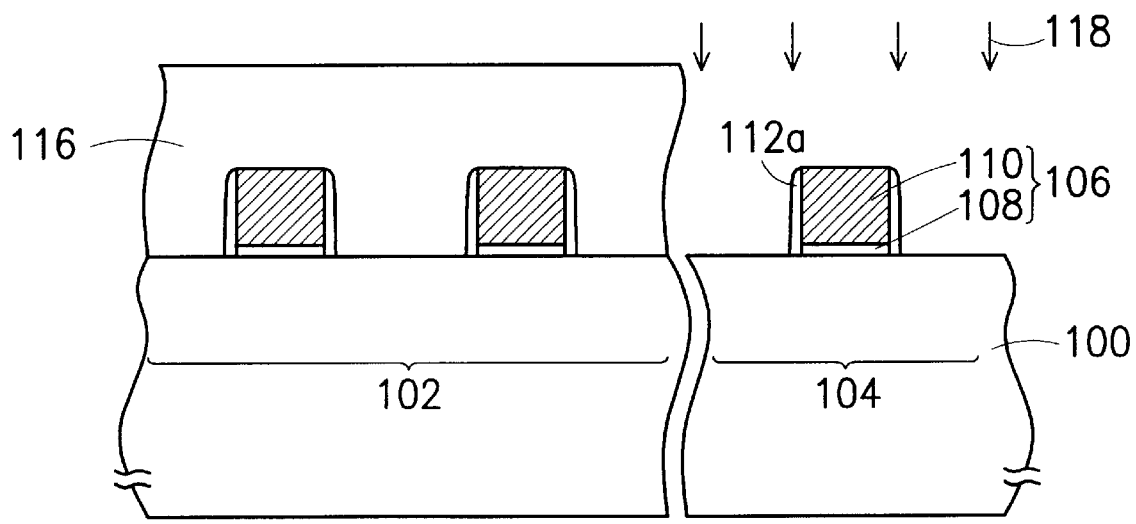

Referring to FIG. 1C, after forming the offset spacer 112a, a punch-through ion implantation is performed on the electrostatic discharge protection device region. A patterned mask layer 116 is formed over the substrate 100, wherein the patterned mask layer may include a photoresist layer which cover the core device region 103 of the substrate 100, while exposing the electrostatic discharge protection device region 104. With the mask layer 116 serving as a implantation mask, the punch-through ion implantation is performed, so that N type ions, such as Arsenic (As) or Phosphorus (P) are implanted into the substrate 100 and the gate structure 106.

Figure 1D:
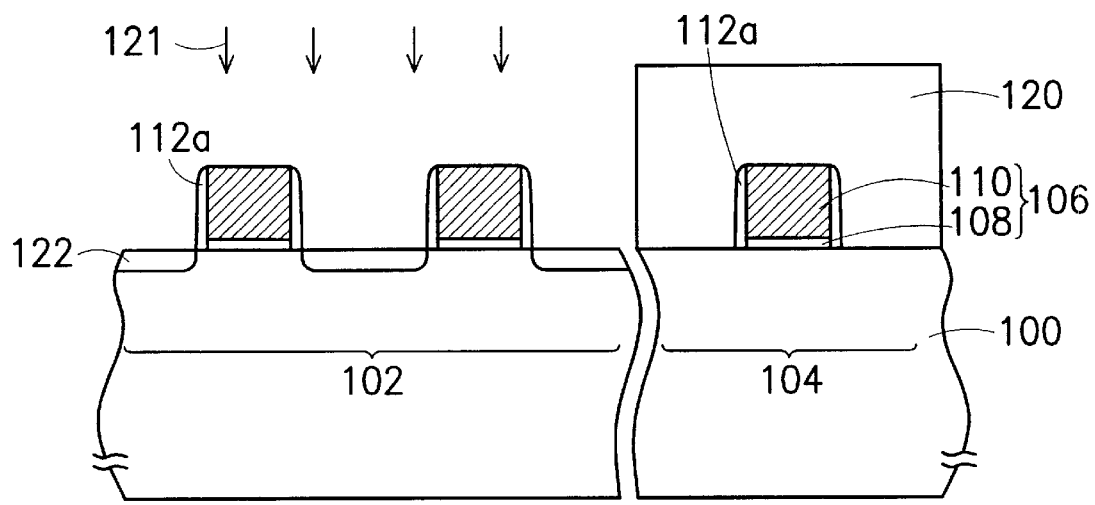

Referring to FIG. 1D, the mask layer 116 is removed after performing the ion implantation. The method of removing the mask layer 116 includes ashing with an oxygen plasma at a temperature between 200° C. and 300° C. According to present invention, the offset spacer 112a is formed on the sidewall of the gate structure before the punch-through implantation process 118 is performed on the electrostatic discharge protection device. Thus, the gate structure 106 would not be broken due to the protection provided by the offset spacer 112, even if the gate structure 106 were subjected to a large thermal stress during the process of removing the mask layer 116.

After that, the core device region 102 of the substrate 100 forms a lightly doped source/drain region 122. The method of forming the lightly doped source/drain region 122 includes forming another photoresist layer 120 over the substrate to cover the electrostatic discharge protection device 104, while exposing the core device region 102. Then, with the gate structure 106 of the core device region 102 and the offset spacer 112 as a mask, a lightly doped ion implantation step 121 is performed to form the lightly doped source/drain region 122 in the substrate 100.

Figure 1E:
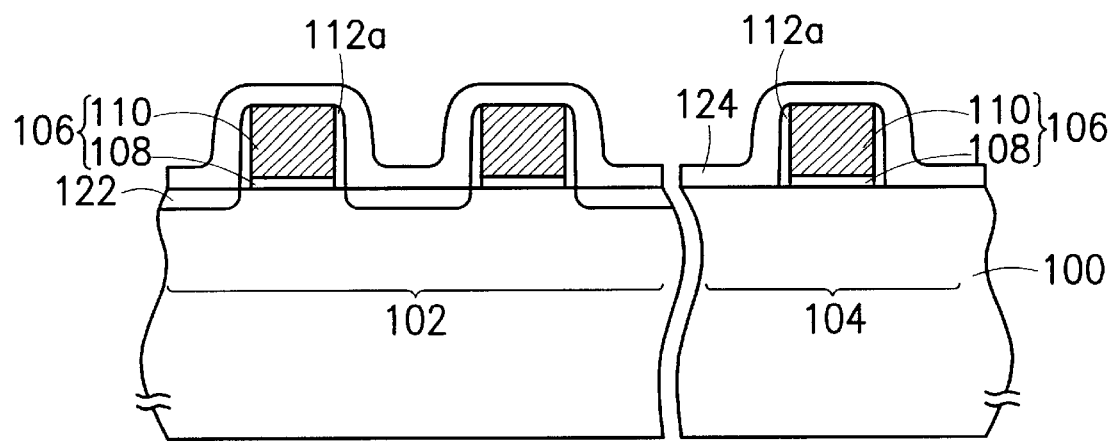

Referring to FIG. 1E, the photoresist layer 120 is removed. A spacer material layer 124 is formed over the substrate 100 to cover the gate structures 106 and offset spacer 112a of the core device region 102 and the electrostatic discharge protection device region 104. The spacer material layer 124 may include a silicon oxide layer or a silicon nitride layer, while the method of forming the spacer material layer 124 includes chemical vapor deposition (CVD).

Figure 1F:
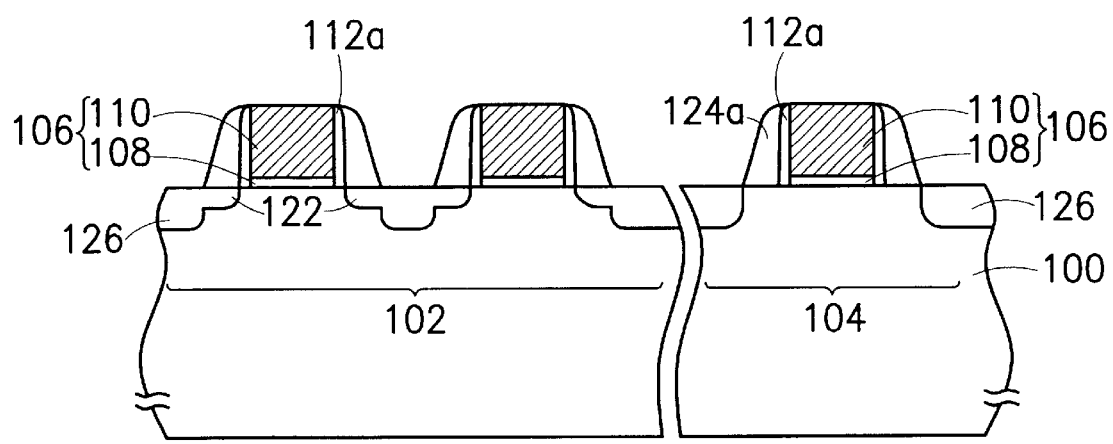

Referring to FIG. 1F, an etching back process, such as anisotropic etching process, is performed on the spacer material layer 124. This removes a part of the spacer material layer 124, so that remaining part of the spacer material layer 124 forms a spacer 124a on an edge of the offset spacer 112a. Eventually, a source/drain region 126 is formed in the core device region 102 and the electrostatic discharge protection device region 104 of the substrate 100.

In the conventional metal-oxide semiconductor, the dopant of the lightly doped drain region diffuses laterally towards the substrate under the gate to induce a gate-to-substrate overlap capacitor. The capacitance of the gate-to-substrate overlap capacitor causes the operation speed to slow down. This is particularly significant when the linewidth of the gate drops to about 0.1 micron. In this embodiment, the formation of the offset spacer avoids the dopant in a lightly doped drain region from diffusing towards the substrate under the gate structure. That is, the formation of the gate-to-substrate overlap capacitor is avoided.

Summarizing from above, the invention provides a method to avoid the drawback of breaking the polysilicon gate can be avoided, while providing advantages of forming the offset spacer, such as preventing the dopant of a lightly doped drain region formed subsequently from diffusing towards the substrate under the gate. Thus, this reduces a gate-to-substrate overlap capacitance, so as to improve the AC performance of the device. As the problems of gate breakage and the gate-to-substrate overlap capacitance are resolved, the invention can be applied to the gate having a smaller linewidth, for example, to the gate of a core transistor with a width of 0.1 micron. A gate of an I/O transistor with a width smaller than 0.31 micron can also be designed.

In addition to avoid the gate-to-substrate overlap capacitance as mentioned above, the offset spacer can also be used to adjust the channel length. For example, when a channel length of 0.31 micron is to be formed, the width of the offset spacer can be adjusted to result in a channel length of 0.31 micron as required by specification, even if the gate only has a width of 0.29 micron.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating the semiconductor device for preventing a polysilicon line from being damaged during removal of a photoresist layer, comprising at least the following steps:

providing a substrate, the substrate comprises at least a core device region and a electrostatic discharge device region;

forming a plurality of polysilicon lines on the core device region and the electrostatic discharge device region of the substrate;

forming a plurality of offset spacers on sidewalls of the polysilicon lines;

forming a first photoresist layer over the substrate, after the step of forming a plurality of the offset spacers, for covering the core device region, so that the electrostatic discharge protection device region is exposed;

performing a punch-through ion implantation on the electrostatic discharge protection device region, with the first photoresist layer serving as a mask;

removing the first photoresist layer;

forming a plurality of lightly doped source/drain regions in the core device region;

forming a plurality of spacers on an edge of the offset spacers; and forming a plurality of source/drain regions in the core device region and the electrostatic discharge protection device region.

2. The method according to claim 1, wherein the step of forming a plurality of offset spacers comprising:

forming an offset spacer material layer over the core device region and the electrostatic discharge protection device region of the substrate; and performing anisotropic etching the offset spacer material layer, so as to form the offset spacers on the sidewalls of the polysilicon lines.

3. The method according to claim 1, wherein the offset spacers include silicon oxide spacers.

4. The method according to claim 1, wherein the offset spacers have a width of about 100 angstroms.

5. The method according to claim 1, wherein the punch-through ion implantation includes implanting N-type ions.

6. The method according to claim 1, wherein the step of forming a plurality of lightly doped source/drain regions in the core device region comprising:

forming a second photoresist layer over the substrate for covering the electrostatic discharge protection device region, so that the core device region is exposed;

performing a lightly doped ion implantation, with the polysilicon lines of the core device region and the offset spacers as a mask, so as to form the lightly doped source/drain region in the substrate; and removing the second photoresist layer.

7. A method of preventing a polysilicon line from being damaged during removal of a photoresist mask for punch-though implanting an electrostatic discharge protection device, the method includes, after a plurality of polysilicon lines is formed on a substrate and before forming a punch-through implant photoresist mask of the electrostatic discharge protection device, forming a plurality of offset spacers on sidewalls of the polysilicon lines.

8. The method according to claim 7, wherein the step of forming the offset spacers comprising:

forming an offset spacer material layer over the core device region and the electrostatic discharge protection device region of the substrate; and etching back the spacer material layer by performing an anisotropic etching, so as to form the offset spacers on the sidewalls of the polysilicon lines.

9. The method according to claim 8, wherein the offset spacers include silicon dioxide spacers.

10. The method according to claim 7, wherein the offset spacers include silicon oxide spacers.

11. The method according to claim 7, wherein the offset spacers having a width of about 100 angstroms.

12. The method according to claim 7, wherein the method of removing the photoresist mask for punch-though implanting the electrostatic discharge protection device includes oxygen plasma ashing.

13. The method according to claim 12, wherein the photoresist mask for punch-though implanting the electrostatic discharge protection device is removed by the oxygen plasma ashing at a temperature of about 200° C. to 300° C.

14. A method of fabricating the semiconductor device, comprising the following steps:

providing a substrate, the substrate comprises at least a core device region and a electrostatic discharge device region;

forming a plurality of polysilicon lines on the core device region and the electrostatic discharge device region of the substrate;

forming a plurality of offset spacers on sidewalls of the polysilicon lines;

forming a mask layer over the substrate, after the step of forming a plurality of the offset spacers, for covering the core device region, so that the electrostatic discharge protection device region is exposed;

performing a punch-through ion implantation on the electrostatic discharge protection device region, with the mask layer serving as an implantation mask;

removing the mask layer;

forming a plurality of lightly doped source/drain regions in the core device region;

forming a plurality of spacers on an edge of the offset spacers; and forming a plurality of source/drain regions in the core device region and the electrostatic discharge protection device region.

15. The method according to claim 14, wherein the step of forming a plurality of offset spacers comprising:

forming an offset spacer material layer over the core device region and the electrostatic discharge protection device region of the substrate; and performing anisotropic etching the offset spacer material layer, so as to form the offset spacers on the sidewalls of the polysilicon lines.

16. The method according to claim 14, wherein the offset spacers include silicon oxide spacers.

17. The method according to claim 14, wherein the offset spacers having a width of about 100 angstroms.

18. The method according to claim 14, wherein the punch-through ion implantation includes implanting N-type ions.

19. The method according to claim 14, wherein the mask layer is a photoresist layer, and the photoresist layer is removed by an oxygen plasma aching at a temperature of about 200° C. to 300° C.

20. The method according to claim 14, wherein the step of forming a plurality of lightly doped source/drain regions in the core device region comprising:

forming a photoresist layer over the substrate for covering the electrostatic discharge protection device region, so that the core device region is exposed;

performing a lightly doped ion implantation, with the polysilicon lines of the core device region and the offset spacers as a mask, so as to form the lightly doped source/drain region in the substrate; and removing the second photoresist layer.

* * * * *